United States Patent [19]

Griffith et al.

[11] Patent Number: 4,588,471

[45] Date of Patent: May 13, 1986

[54] PROCESS FOR ETCHING COMPOSITE CHROME LAYERS

[75] Inventors: Jonathan H. Griffith, Poughkeepsie; Everton H. Henriques, Highland; James L. Kehoe, III, Salisbury Mills; Marshall J. Suskie, Saugerties, all of N.Y.

[73] Assignee: International Business Machines Corporation, Armonk, N.Y.

[21] Appl. No.: 715,253

[22] Filed: Mar. 25, 1985

[51] Int. Cl.$^4$ ............................................. C23F 1/02
[52] U.S. Cl. .................................. 156/652; 156/656; 156/659.1; 156/664; 156/666; 252/79.2; 252/79.3; 252/79.4

[58] Field of Search ................... 156/652, 656, 659.1, 156/661.1, 664, 666; 252/79.2, 79.3, 79.4

[56] References Cited

U.S. PATENT DOCUMENTS

| | | | |
|---|---|---|---|
| 4,160,691 | 7/1979 | Abolafia et al. | 156/656 X |
| 4,498,954 | 2/1985 | Huston et al. | 156/651 |
| 4,517,051 | 5/1985 | Gazdik et al. | 156/652 X |

*Primary Examiner*—William A. Powell
*Attorney, Agent, or Firm*—Jerome J. Norris; Joseph J. Connerton

[57] ABSTRACT

Chrome/copper/chrome conductor arrays deposited on glass plates are etched with an aqueous acidic composition which contains an acid and a thiourea compound.

24 Claims, No Drawings

PROCESS FOR ETCHING COMPOSITE CHROME LAYERS

TECHNICAL FIELD

The present invention relates to compositions suitable for use as etchants for etching composite chrome layers. In particular, the present invention is concerned with acidic etching compositions especially applicable in etching composite chrome-copper-chrome conductor arrays deposited on glass plates and used in process of fabricating gas panels.

BACKGROUND OF THE INVENTION

In the manufacture and fabrication of gas panels many different types of materials are used, and in numerous types of such construction very small and very thin parallel electrical conductors are deposited on substrates, and a pair of such substrates are disposed on opposite sides of a chamber filled with an illuminable gas with one set of the parallel electrical conductors extending orthogonally with respect to the other set of parallel electrical conductors to define coordinate intersections. A given one of the parallel electrical conductors from each set is energized with electrical signals to ignite the region of the illuminable gas around a selected coordinate intersection. The electrical conductors are made as narrow and thin as desired in order to obtain a greater number of coordinate intersections per square inch of the gas panel.

Often times however, commercial gas panels entail, in part, the use of a conductor array fabricated by applying to a glass plate, a chrome layer, followed by a copper layer, followed by another chrome layer. Also, sometimes a cermet layer is placed between the glass plate substrate and bottom chrome layer. Next, a photoresist composition is applied so that selected areas of the chrome/copper/chrome/cermet layers can be removed to provide the desired electrical connections on the substrates.

Glass is deposited over the top chrome layer to ensure separation of the parallel lines. The copper layer provides electrical conductivity. The bottom chrome layer is applied to ensure adequate adhesion between the copper and the glass or cermet. The cermet in conjunction with subsequently applied material acts as a resistor in the final product.

The etching of the chrome layers has been carried out employing etchant compositions having a high pH, such as aqueous compositions containing $KMnO_4$. The use of aqueous etchant compositions having a high pH is not entirely satisfactory, since $KMnO_4$ tends to attack the photoresist to some extent as well as the chrome layers.

Further, commercially available positive photoresist materials such as those based on phenolic-formaldehyde novalak polymers are not resistant to the highly basic etchant compositions employed to etch the chrome, and, accordingly will not protect the non-etched areas.

Therefore, the ability to employ a positive photoresist is advantageous for the reason that a positive resist is less sensitive to dirt or other contaminants than is a negative photoresist, because only the exposed areas of a positive photoresist are developed and etched away. Consequently, if dirt or another contaminant matter is present, it will remain on the unexposed portion, and will not play a significant part in regard to formation of defects. By contrast, with a negative photoresist, the exposed areas are cured and the unexposed areas are etched away.

In addition, the ability to use a positive photoresist makes it possible to employ a single coating to prepare several different circuits by exposing, developing and etching the required surface and then repeating the steps as many times as needed. Furthermore, positive resists provide sharper image resolution as compared to negative resists, since the desired image does not swell and remains unchanged during the development with the particular solvent. Further still, the unexposed positive photoresist can be readily removed when desired by simple chemical solvents which include N-methyl-2-pyrrolidone for many commercially available positive resists and/or reexposed to suitable light, and then removed with the same solution employed to develop the circuitry. Additionally, aqueous solutions that are highly basic such as sodium hydroxide can also effectively remove the photoresist.

However, the various commercially available positive photoresists, such as the methacrylate polymers, necessitate an etchant for the underlying chrome which is on the acidic side. Although certain acidic etchants have been suggested for chrome, they are not entirely satisfactory. For instance, the etching with various prior acidic etchants is very slow at the start but then accelerates very rapidly forming or generating relatively large amounts of gas which are uncontrollable and cause the formation of bubbles. This is not suitable, especially for fine line circuitry. Moreover, sometimes the chrome surface is not even etched at all in such acidic etchants which may be possible due to passivation of the chrome surface.

It has previously been found that mixtures of glycols and diluted HCl etch chromium at ambient temperatures. But, when etching the lower chromium layer, the exposed edges of the top chromium layer etch during the relatively longer times needed to etch the lower layer so that undercutting of the top layer occurs. This in turn results in a portion of the copper being exposed at the top edges and ends of the conductor lines, and this could render the structure inoperative upon subsequent or further fabrication.

It has also been found that a concentrated HCl mixture of about 50% or more by volume provides an etch time for the lower chromium layer which sufficiently minimizes the undercutting of the top chromium layer; however, these concentrated mixtures attack the cermet, when used, and cause unacceptable changes in its resistivity.

These problems of undercutting of the top chromium layer and changes in the resistivity of the cermet have been minimized by employing the invention disclosed in U.S. Pat. No. 4,160,691 to Abolafia, et al. wherein certain concentrated HCl compositions are employed at temperatures from about 50° to about 95° C. Although, the invention disclosed and described in U.S. Pat. No. 4,160,691 does minimize undercutting of the top chromium layer and the changes in resistivity of the cermet occasioned by other acidic compositions, it is still not entirely satisfactory. The compositions are still in need of improvement with respect to pH stability during use, and improvement with respect to storage stability over relatively long periods of time would still be useful.

Most importantly, however, is the fact that etching the top and bottom chrome layers of a chrome-copper-chrome conductor array deposited on a glass plate employing prior art etchants such as potassium permanganate entailed the numerous steps of: contacting the upper chrome layer with potassium permanganate and washing off excess permanganate with water; contacting the intermediate copper layer with ammonium persulfate and washing off the persulfate with water; and contacting the lower chrome layer with potassium permanganate. However, in the case of the lower chrome layer, it is necessary to remove the manganese component of the potassium permanganate etchant even after the rinse with water, by using an oxalic acid rinse followed by a water rinse. Thereafter, a second etching step using more potassium permanganate was required, and this was followed by a final water rinse.

It is believed that the lower chrome layer next to the glass or cermet has a higher oxide content than the upper chrome layer and is more difficult to etch. Therefore to ensure thorough etching, it was necessary to remove the manganese component of the potassium permanganate from the lower chrome layer with oxalic acid, and conduct another or second etching step on the lower chrome layer with additional potassium permanganate.

DISCLOSURE OF THE INVENTION

The present invention provides an etchant composition which is acidic and which is capable of etching a top and bottom chrome layer of a chrome-copper-chrome conductor array deposited on a glass plate in a simpler, more controllable, less expensive, and faster way than prior art processes employing potassium permanganate.

This is accomplished by applying a layer of photoresist containing the desired conductor pattern on the surface of chrome-copper-chrome layers, contacting the upper chrome layer with an acidic aqueous etchant composition containing water, an inorganic acid, and at least one thiourea compound selected from the group of thiourea, substituted thiourea, and mixtures thereof, rinsing off the acidic etchant; contacting the exposed copper layer with an acid etch to strip the surface of said copper to conform to the conductor pattern, rinsing off the acid etch; contacting the lower chrome surface with the same acidic etchant as used on said upper surface; and rinsing off the acidic etchant.

By using the compositions in the process of the present invention, the second etching step of the lower chrome layer, which is required in the permanganate process is eliminated, and it is not necessary to employ the oxalic acid step because the lower chrome layer is thoroughly etched in a single etch with the compositions of the invention.

The compositions of the present invention are pH stable during use and over long periods of time and can be stored without detrimental effect to the composition, for relatively long periods of time. Further, with the etchant compositions of the invention, bubble formation is substantially eliminated. Moreover, excellent resolution is achieved with the etchant compositions of the invention. The invention also makes it possible to employ positive photoresists which are commercially available since these are resistant to the etchant compositions of the invention. Moreover, the present invention provides for uniform etching of the chromium.

In particular, the present invention is concerned with a method for etching a top and bottom chrome layer of a chrome-copper-chrome conductor array deposited on a glass plate comprising:

applying a layer of photoresist containing the desired conductor pattern on the surface of said chrome-copper-chrome layers, contacting the upper chrome layer with an acidic aqueous etchant composition containing water, an inorganic acid, and at least one thiourea compound selected from the group of thiourea, substituted thiourea, and mixtures thereof, and rinsing off the acidic etchant, contacting the exposed copper layer with an acid etch to strip the surface of said copper to conform to the conductor pattern, and rinsing off the acid etch, and contacting the lower chrome surface with the same acidic etchant as said upper surface, and rinsing off the acidic etchant.

The invention is further in particular concerned with improvements in the process of forming gas panels, and reference is made as an incorporation by reference to U.S. Pat. Nos. 3,804,609 and 3,837,724 as typical processes in which the aqueous acidic etching compositions can be used as a step in forming such panels. Furthermore, the invention is concerned with certain compositions which consist essentially of water, about 1 to about 10% by volume of sulfuric acid, and about 1 to about 10% by weight of thiourea and/or substituted thiourea.

DETAILED DESCRIPTION OF THE INVENTION

The acidic aqueous compositions of the invention contain an inorganic acid and the acid employed under conditions of use must be capable of etching chrome. Examples of inorganic acids are hydrofluoric acid, hydrochloric acid, phosphoric acid, and preferably sulfuric acid. Mixtures of acids can be used if desired. One particular advantage of the invention is that the invention makes it possible to provide an etchant composition for chromium which does not require hydrochloric acid. Also, preferably, the compositions of the invention should be substantially, if not entirely, free from nitric acid since it tends to attack copper, which is present beneath the top chrome layer in the articles treated by the compositions of the invention.

The acid is present in the composition in amounts sufficient to etch the chrome, and these amounts are usually from about 1.0 to about 20% by weight of the aqueous composition. Preferred amounts of the acid is 3 to 10% by volume at a temperature from about 30° to 90° C., preferably 30° to 70° C. and this renders the pH of the composition less than ($<2.5$); preferably, between 0 and 2, and most preferably between 0 and 1.

In addition, the compositions of the present invention must include thiourea or at least one substituted thiourea or mixtures thereof. Examples of some substituted thiourea compounds include alkylthiourea compounds such as 1, 3-dimethylthiourea, 1, 3-diethylthiourea, 1, 3-diisopropylthiourea, and 1, 3-dibutylthiourea; allylthiourea; diphenylthiourea; and ethylenethiourea. The preferred compound employed is thiourea. The amount of the thiourea compound employed is usually about 1 to about 10% by weight, and preferably about 2 to about 5% by weight.

The compositions of the present invention are especially suitable for etching chrome and for selectively etching chrome layers without affecting underlying copper, without affecting positive photoresist materials, and without significantly affecting the resistivity of cermet, which may also be present beneath the chrome. The etching can be achieved by immersing the particular article to be etched in a bath of the composition and maintaining the material to be etched in contact with the composition for about 10 seconds to about 10 minutes, and preferably for about 30 seconds to about 3 minutes. The composition is capable of etching chromium at a rate of 2000 Å per minute, and at one fifth the cost per unit batch over the prior art permanganate process.

The acidic aqueous compositions of the invention are approximately one-fifth less expensive than the potassium permanganate etch. Moreover the pH of the acidic aqueous compositions is not critical within the acid range (i.e. 0 to 7), and with a constant thiourea concentration, the etching speed varies with the acid concentrations. Further, in contrast to the etching process using potassium permanganate, the photoresist layer in the invention process requires either no baking or a shorter baking time because it is not attacked by the acid etch. The acidic solution can be applied using spray or immersion techniques for etching and, due to the less expensive cost of the acidic aqueous compositions together with elimination of the oxalic acid rinse and the second potassium permanganate etching step required in the prior art process, the speed of the etching in the present invention is much faster and the cost of the etching in the present invention, especially as part of the gas panel fabricating process, is substantially lower than that in the potassium permanganate process.

The compositions of the present invention are employed generally at temperatures of about 30° C. up to about the boiling point of the compositions, and preferably no higher than about 90° C. The preferred temperatures are about 30° to about 70° C. The time and temperature of the etching are inversely related. For example, at the lower temperatures longer immersion times of up to about 10 minutes are employed for etching away about 1,000 Å of chromium. Further, the time is somewhat related to the thickness of the material to be etched away.

A particular type of article etched according to the invention is a glass plate on top of which is a first layer of about 1,600 Å chromium, followed by a layer of about 25,000 Å of copper, on top of which is another 1,600 Å chromium layer. If desired, a cermet, such as a silicon monoxide cermet material can be placed between the glass plate and the first chromium layer.

A typical example of a suitable cermet is obtained from firing a composition containing chrome and silicon monoxide.

The following example is presented to further illustrate the invention in a nonlimiting way.

EXAMPLE I

An etch solution is prepared by dissolving sufficient concentrated sulfuric acid (i.e. about 98% concentration) in water to obtain 3 to 10% by volume of the acid in water and thiourea is added so that it is from 3 to 10% by weight of the deionized water.

A glass plate having a 1,600Å layer of chrome, on top of which is a 25,000 Å layer of copper, on top of which is another 1,600Å layer of chrome on top of which is a layer of photoresist containing the desired conductor pattern is immersed in the etch solution. The solution is at a temperature between 30° to 70° C. The top chrome layer of 1,600Å is etched away in about two minutes, and the acidic solution is washed off with deionized water. A predetermined portion of the copper is then etched away with an ammonium persulfate solution, and the bottom chrome layer is etched away with the same solution used to etch away the upper layer, after washing off the ammonium persulfate with deionized water. There is only minimum undercutting of the top chromium during the etching of the bottom chromium layer.

What is claimed is:

1. A method of etching a top and bottom chrome layer of a chrome-copper-chrome conductor array deposited on a glass plate comprising:
    applying a layer of photoresist containing the desired conductor pattern on the surface of said chrome-copper-chrome layers,
    contacting the upper chrome layer with an acidic aqueous etchant composition containing water, an inorganic acid, and at least one thiourea compound selected from the group of thiourea, substituted thiourea, and mixtures thereof, and rinsing off the acidic etchant,
    contacting the exposed copper layer with an acid etch to strip the surface of said copper to conform to said conductor pattern, and rinsing off the acid etch, and
    contacting the lower chrome surface with the same acidic etchant as said upper surface, and rinsing off the acidic etchant.

2. The method of claim 1 wherein water is the rinsing material.

3. The method of claim 2 wherein the photoresist material is a positive photoresist material.

4. The method of claim 1 wherein the contacting time on the upper and lower chrome layers is carried out for about 10 seconds to about 10 minutes, and the temperature employed is about 30° to about 90° C.

5. The method of claim 1 wherein the acid used on chrome layers is present in the amount of about 1.0 to about 20% by weight and the pH of the composition is about 2 or less.

6. The method of claim 1 wherein the acid used on the chrome layers is present in an amount of about 8 to about 10% by weight based upon the weight of the composition.

7. The method of claim 1 wherein the pH of the etchant used on the chrome layers is about 0 to about 2.

8. The method of claim 1 wherein the pH of the etchant used on the chrome layers is about 0 to about 1.

9. The method of claim 1 wherein the acid in the acidic aqueous etchant composition is selected from the group of hydrofluoric acid, hydrochloric acid, phosphoric acid, sulfuric acid or mixtures thereof.

10. The method of claim 1 wherein said acid in the acidic aqueous etchant composition is sulfuric acid.

11. The method of claim 1 wherein the amount of said thiourea compound is about 1 to about 10% by weight.

12. The method of claim 1 wherein the amount of said thiourea compound is about 1 to about 3% by weight.

13. The method of claim 1 wherein the thiourea compound is thiourea.

14. The method of claim 13 wherein the acid in the acidic aqueous etchant composition is sulfuric acid.

15. The method of claim 1 wherein the temperature of the acidic aqueous etchant composition used on the chrome layers is about 30° to 90° C.

16. The method of claim 1 wherein said substituted thiourea compound is selected from the group of alkylthiourea compounds, phenylthiourea compounds and mixtures thereof.

17. The method of claim 1 wherein chrome-copper-chrome conductor arrays are used in fabrication of gas panels.

18. The method of claim 1 wherein the acidic aqueous etchant composition consists essentially of water, about 8 to about 10% by weight of sulfuric acid, and about 1 to about 10% by weight of at least one thiourea compound selected from the group of thiourea, substituted thiourea, and mixtures thereof.

19. The method of claim 18 wherein the thiourea compound is thiourea.

20. The method of claim 18 wherein the amount of the thiourea compound is about 1 to about 3% by weight.

21. The method of claim 1 wherein the acidic aqueous etchant composition consists essentially of about 1.5 to about 20% by weight of an acid selected from the group of hydrofluoric acid, hydrochloric acid, phosphoric acid, sulfuric acid, and mixtures thereof, about 1 to about 10% by weight of at least one thiourea compound selected from the group of thiourea, substituted thiourea, and mixtures thereof; and wherein the pH of the composition is about 2 or less.

22. The method of claim 21 wherein the thiourea compound is thiourea.

23. In a process of fabricating gas panels in which layers of a chromium/copper/chromium conductor array are formed on glass plates in which successive layers of chromium, copper and chromium are removed by selective etching through patterned resist masks, the improvement which comprises, contacting the upper chrome layer with an acidic aqueous etchant composition containing water, an inorganic acid, and at least one thiourea compound selected from the group of thiourea, substituted thiourea, and mixtures thereof, rinsing off the acidic etchant, contacting the exposed copper layer with an acid etch to strip the surface of the copper to conform to the pattern of the resist mask, rinsing off the acid etch, contacting the lower chrome surface with the same acidic etchant as the said upper surface, and rinsing off the acidic etchant.

24. In a process of fabricating gas panels in which layers of a chromium/copper/chromium conductor array are formed on a cermet layer on a glass plate in which successive layers of cermet, chromium, copper and chromium are removed by selective etching through patterned resist masks, the improvement which comprises, contacting the upper chrome layer with an acidic aqueous etchant composition containing water, an inorganic acid, and at least one thiourea compound selected from the group of thiourea, substituted thiourea, and mixtures thereof, rinsing off the acidic etchant, contacting the exposed copper layer with an acid etch to strip the surface of the copper to conform to the pattern of the resist mask, rinsing off the acid etch, contacting the lower chrome surface with the same acidic etchant as said upper surface, and rinsing off the acidic etchant.

* * * * *